United States Patent
Sunwoo et al.

(12) 
(10) Patent No.: US 7,659,785 B2
(45) Date of Patent: Feb. 9, 2010

(54) VOLTAGE CONTROLLED OSCILLATOR AND PLL HAVING THE SAME

(75) Inventors: Jung Sunwoo, Yeongdeungpo-gu (KR); Young-Don Choi, Anseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 20 days.

(21) Appl. No.: 11/769,114

(22) Filed: Jun. 27, 2007

(65) Prior Publication Data

US 2008/0111637 A1 May 15, 2008

(30) Foreign Application Priority Data

Nov. 15, 2006 (KR) .................... 10-2006-0112556

(51) Int. Cl.
*H03K 3/03* (2006.01)
(52) U.S. Cl. ................ 331/57; 331/2; 331/16; 331/17
(58) Field of Classification Search ............... 331/1 R, 331/10, 11, 16, 25, 34, 44, 57, 179, 182–183, 331/185–187; 327/156, 157; 375/373–376
See application file for complete search history.

(56) References Cited

U.S. PATENT DOCUMENTS

| | | | |
|---|---|---|---|
| 6,072,372 A * | 6/2000 | Yokoyama | 331/57 |
| 6,316,991 B1 * | 11/2001 | Muyshondt et al. | 327/543 |
| 6,597,249 B2 | 7/2003 | Chien et al. | |
| 6,617,933 B2 | 9/2003 | Ito et al. | |
| 6,774,732 B1 | 8/2004 | Harnishfeger et al. | |
| 7,023,282 B1 | 4/2006 | Humpreys et al. | |
| 2005/0105661 A1 * | 5/2005 | Miller et al. | 375/376 |
| 2005/0218947 A1 | 10/2005 | Tanaka | |
| 2006/0009184 A1 | 1/2006 | Goldman | |

* cited by examiner

*Primary Examiner*—James H. Cho
*Assistant Examiner*—Jany Tran
(74) *Attorney, Agent, or Firm*—Volentine & Whitt, PLLC

(57) ABSTRACT

A Voltage Controlled Oscillator (VCO) includes a plurality of oscillation units connected in cascade to form a chain; and a plurality of current source sections operatively connected to the oscillation units, the current source sections each being configured to control current provided to the oscillation units, wherein each of the current source sections includes: at least one fixed current source configured to perform a current control of a corresponding oscillation unit by using a fixed voltage; and at least one variable current source configured to perform a current control of the corresponding oscillation unit by using a variable voltage.

6 Claims, 6 Drawing Sheets

10

VOLTAGE CONTROLLED OSCILLATOR AND PLL HAVING THE SAME

BACKGROUND

1. Field of the Invention

The present disclosure relates generally to a phase lock loop (PLL) and, more particularly, to a voltage controlled oscillator and a PLL having the same.

A claim of priority is made under 35 U.S.C. §119 to Korean Patent Application 10-2006-0112556, filed on Nov. 15, 2006, the contents of which are hereby incorporated by reference in their entirety.

2. Description of the Related Art

A phase lock loop (PLL) circuit is generally used as a circuit for synchronizing signals. These synchronized signals may then be used in a variety of electronic applications such as, for example, computers, radios, telecommunications equipment, and other such applications where it is desirable to stabilize a generated signal, or detect noise. Thus, PLL circuits have been extensively used in devices such as, for example, frequency synthesizers, FM demodulators, clock recovery circuits, Modems, and tone decoders.

Most PLL circuits include a voltage controlled oscillator (VCO). The VCO generally provides an output voltage via a feedback loop that is compared with the reference voltage provided to the PLL circuit. Furthermore, depending on the application, either the output of the VCO, or a control signal to the VCO, provides the useful output of the PLL system.

In particular, the PLL circuit generates a target frequency by using a VCO to generate an oscillation frequency. The VCO generates this oscillation frequency based on a control voltage applied to the VCO. However, the control voltage applied to the VCO reacts sensitively to even a small change of input frequency. The change of input frequency may be due to undesirable factors such as, for example, noise. The change in control voltage to the VCO may affect the output frequency of the VCO by causing undesirable effects such as jitter in the output frequency. This jitter in the output frequency may in turn affect the performance of the PLL that receives the output signal of the VCO as in input signal.

As described above, the performance of a VCO may affect the entire performance of the PLL circuit. In order to enhance a performance of the PLL circuit, the VCO should beneficially be small in gain, operate only in a required frequency band, and be insensitive to noise.

Different types of VCOs are used in the industry. For example, FIGS. 1 and 2 illustrate a VCO that is made up by linking a number of inverters to form an inverter chain. Referring to FIG. 1, the VCO includes a plurality of inverters 10 that are connected with each other to form an inverter chain. In particular, the inverter chain includes a plurality of inverters 10 connected in cascade. Furthermore, plural current sources may be used to control current flowing through the plurality of inverters.

An inverter circuit 10 constituting the inverter chain is illustrated in FIG. 2. With reference to FIG. 2, the inverter circuit 10 of the inverter chain includes a PMOS transistor P10 configured as a pull-up element and an NMOS transistor N10 configured as a pull-down element. In addition, a load L10 may be connected between a power source voltage (VDD) terminal and the PMOS transistor P10. Furthermore, current sources 12 each are configured to control current provided to a pull-up element P10 and a pull-down element N10 of each inverter circuit 10.

Generally, as shown in FIG. 2, the current sources 12 are provided using NMOS transistors N12 and N14. Transistors N12 and N14 are connected between one end of the pull-down element N10 and ground. Furthermore, as also shown in FIG. 2, the current sources are controlled by voltages $V_{CC}$ and $V_{CF}$. Specifically, Vcc is known as a coarse voltage and $V_{CF}$ is known as a fine voltage. The coarse voltage Vcc and the fine voltage $V_{CF}$ are each provided in common to the inverter chain.

The coarse voltage Vcc is to perform a coarse tuning for a voltage control of the VCO, and the fine voltage $V_{CF}$ is to perform a fine tuning. Primarily the coarse tuning is performed to reach a target frequency area, and then the fine tuning is performed to generate the target frequency. This process will now be described in FIG. 3.

FIG. 3 is a graph illustrating the relation between an output frequency of a VCO and an input voltage provided to the VCO. The X-axis indicates voltage, and the Y-axis indicates frequency. As shown in FIG. 3, the coarse tuning is performed first. During the coarse tuning, the coarse voltage Vcc is changed within a range of 0 V to power source voltage VDD. Furthermore, the coarse tuning is performed until the output frequency of the VCO reaches close to a target frequency $F_{target}$. When the output frequency of the VCO reaches close to the target frequency $F_{target}$, the coarse voltage Vcc is fixed. Then, the fine tuning is performed.

The fine tuning is performed by changing the fine voltage $V_{CF}$ within a range of 0V to power source voltage VDD. Then, when the output frequency of the VCO exactly coincides with the target frequency $F_{target}$, the fine voltage $V_{CF}$ is fixed.

As described above, jitter in the VCO and the PLL may be reduced by using a combination of coarse tuning and fine tuning However, this process suffers from a number of problems. For example, as shown in FIG. 3, a gain $K_{vco1}$ of the VCO is large. This large gain $K_{vco1}$ of the VCO may cause a large change in frequency for even a slight variation in the control voltage. This high level of sensitivity of the VCO may affect the overall performance of the PLL circuit using the VCO because of problems such as, for example, increased jitter.

The present disclosure is directed towards overcoming one or more shortcomings associated with the conventional VCO and PLL circuits employing the same.

SUMMARY OF THE INVENTION

An aspect of the present disclosure includes a voltage controlled oscillator (VCO). The VCO includes a plurality of oscillation units connected in cascade to form a chain; and a plurality of current source sections operatively connected to the oscillation units, the current source sections each being configured to control current provided to the oscillation units, wherein each of the current source sections includes: at least one fixed current source configured to perform a current control of a corresponding oscillation unit by using a fixed voltage; and at least one variable current source configured to perform a current control of the corresponding oscillation unit by using a variable voltage.

Another aspect of the present disclosure includes a phase lock loop (PLL) circuit. The PLL circuit comprises a phase and frequency detector configured to compare a phase and a frequency of a reference clock signal with a phase and a frequency of a signal output from a voltage divider, and to generate a signal based on the comparison; a charge pump configured to generate current or discharge current in response to the comparison signal output from the phase and frequency detector; a loop filter configured to filter the charge current or the discharge current output from the charge pump, to eliminate a high frequency component, and generate a control voltage; a voltage controlled oscillator configured to generate an output frequency corresponding to the control voltage based on an initial current control with a fixed voltage and a subsequent current control with a variable voltage; and a frequency divider configured to divide the output frequency by a given number and generate an oscillation clock frequency.

BRIEF DESCRIPTION OF THE DRAWINGS

The present disclosure will become more fully understood from the detailed description given herein below and the accompanying drawings which are given by way of illustration only, and thus are not limitative of the present invention, and wherein.

DETAILED DESCRIPTION

Exemplary embodiments of the present invention now will be described more fully hereinafter with reference to FIGS. 4 to 8. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 4:
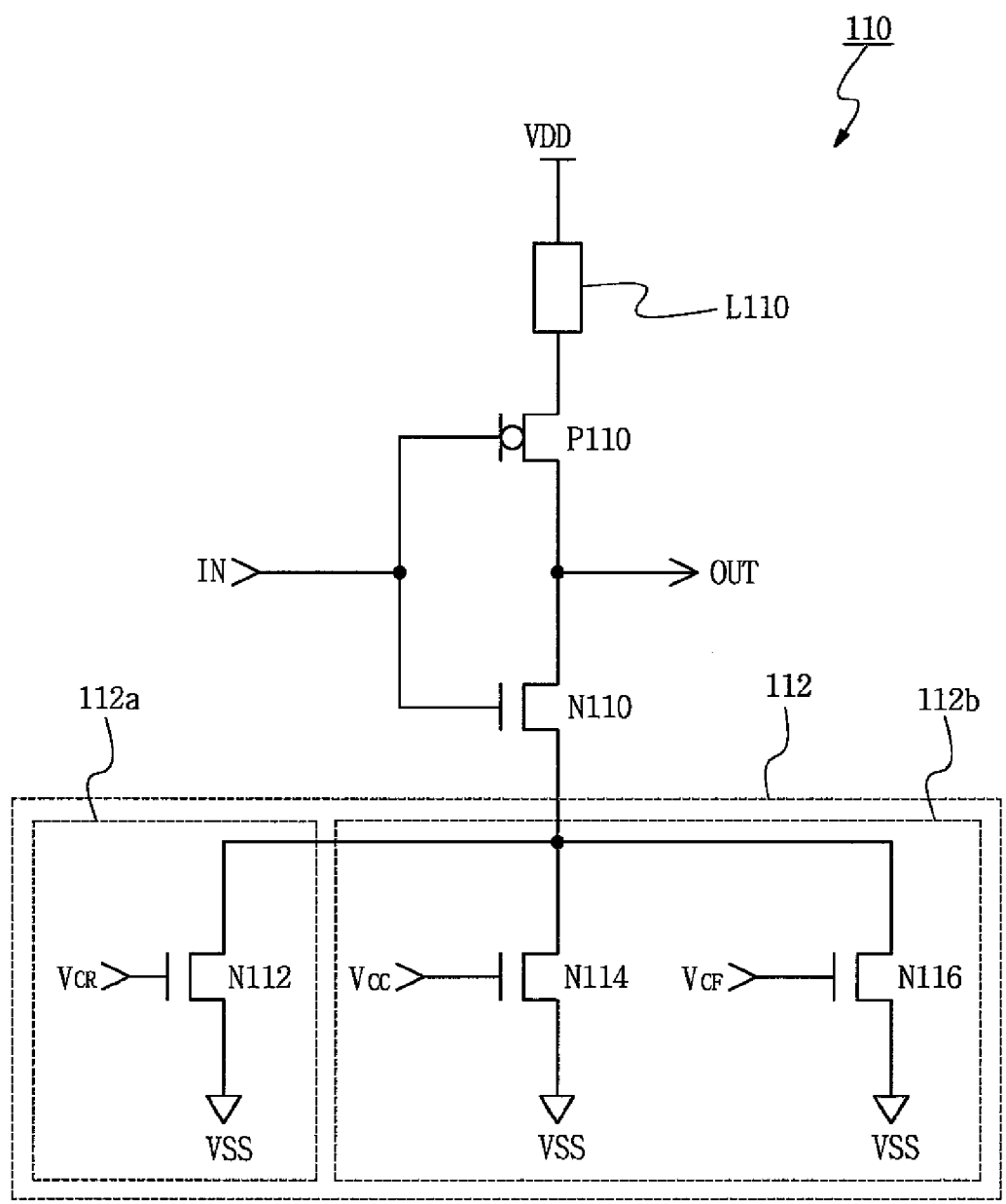
FIG. 4 is a circuit diagram of a VCO according to an exemplary disclosed embodiment.

FIG. 4 illustrates an example of oscillation unit 110 of a VCO according an exemplary disclosed embodiment. The disclosed VCO includes a chain of oscillation units connected in a cascade formation. One skilled in the art will appreciate that while the disclosed oscillation unit is an inverter, other oscillation units such as, for example, a mirror circuit, a differential-delay circuit, etc., may also be used without departing from the scope of the disclosure.

As shown in FIG. 4, the oscillation unit 110 includes an inverter circuit. In particular, the oscillation unit 110 includes a PMOS transistor P110 as a pull-up element and an NMOS transistor N110 as a pull-down element. Furthermore, a load L110 may be configured between a power source voltage (VDD) terminal and the PMOS transistor P110. Additionally, current sources 112 are adapted to control current of the pull-up element P110 and the pull-down element N10. Each of the current sources 112 is composed of NMOS transistors N112, N114, and N116, being connected between one end of the pull-down element N110 and a ground, to control current flowing in the oscillation unit 110.

The current sources 112 may be divided into a fixed current source 112a and a variable current source 112b. The fixed current source 112a receives a fixed voltage $V_{CR}$ to control the current to transistors N110 and P110. The variable current source 112b receives a variable control voltage, $V_{CC}$ and $V_{CF}$, to control the current to the transistors N110 and P110. The voltage $V_{CC}$ and $V_{CF}$ to each of transistors N114 and N116 is variable because the voltage may vary from a ground voltage to power source voltage VDD. Thus, in an exemplary embodiment, a fixed current source 112a controlled by a fixed voltage $V_{CR}$ is used in addition to the variable voltages $V_{CC}$ and $V_{CF}$.

The fixed current source 112a may include an NMOS transistor N112 controlled by the fixed voltage $V_{CR}$. At least one fixed current source 112a is provided for each of the oscillation units. If more than one fixed current source 112a is used, the fixed current sources 112a coupled to each of the oscillation units are controlled in common by the fixed direct voltage $V_{CR}$.

The configuration of variable current source 112b is as follows. At least one variable current source 112b is provided for each of the oscillation units, and is controlled in common by variable control voltage $V_{CC}$ and $V_{CF}$, which are varied from 0V to a level of power source voltage VDD. As shown in FIG. 4, in an exemplary embodiment, each variable current source 112b may be composed of two transistors. However, each variable current source 112b may also be composed of only one transistor without departing from the scope of the disclosure.

In an exemplary embodiment, the fixed voltage $V_{CR}$ to control the fixed current source 112a may be a reference direct-current voltage. The reference direct-current voltage indicates a voltage corresponding to a reference clock frequency provided to the PLL circuit. An exemplary method for generating the reference direct-current voltage $V_{CR}$ will be described below.

Figure 1:
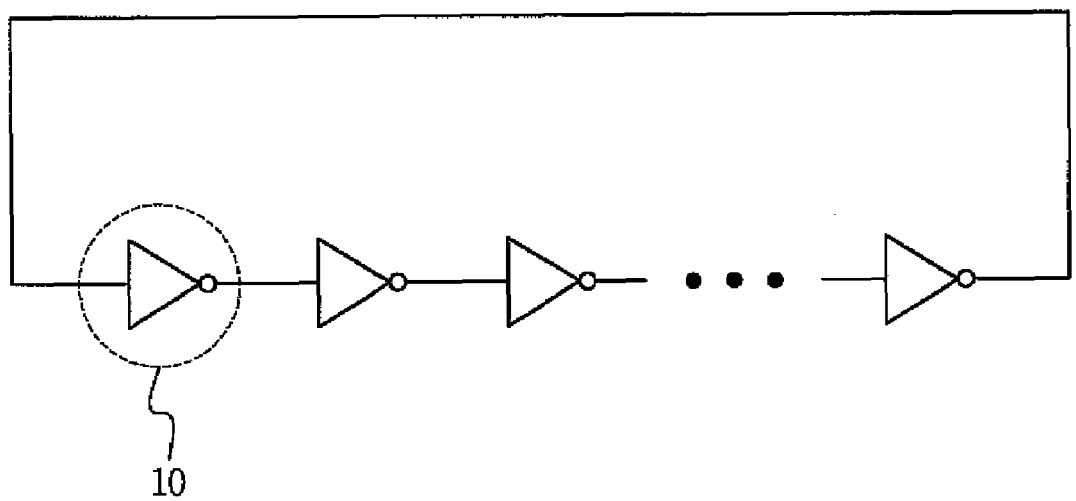
FIG. 1 is a circuit diagram of a VCO based on a conventional inverted chain.
Figure 2:
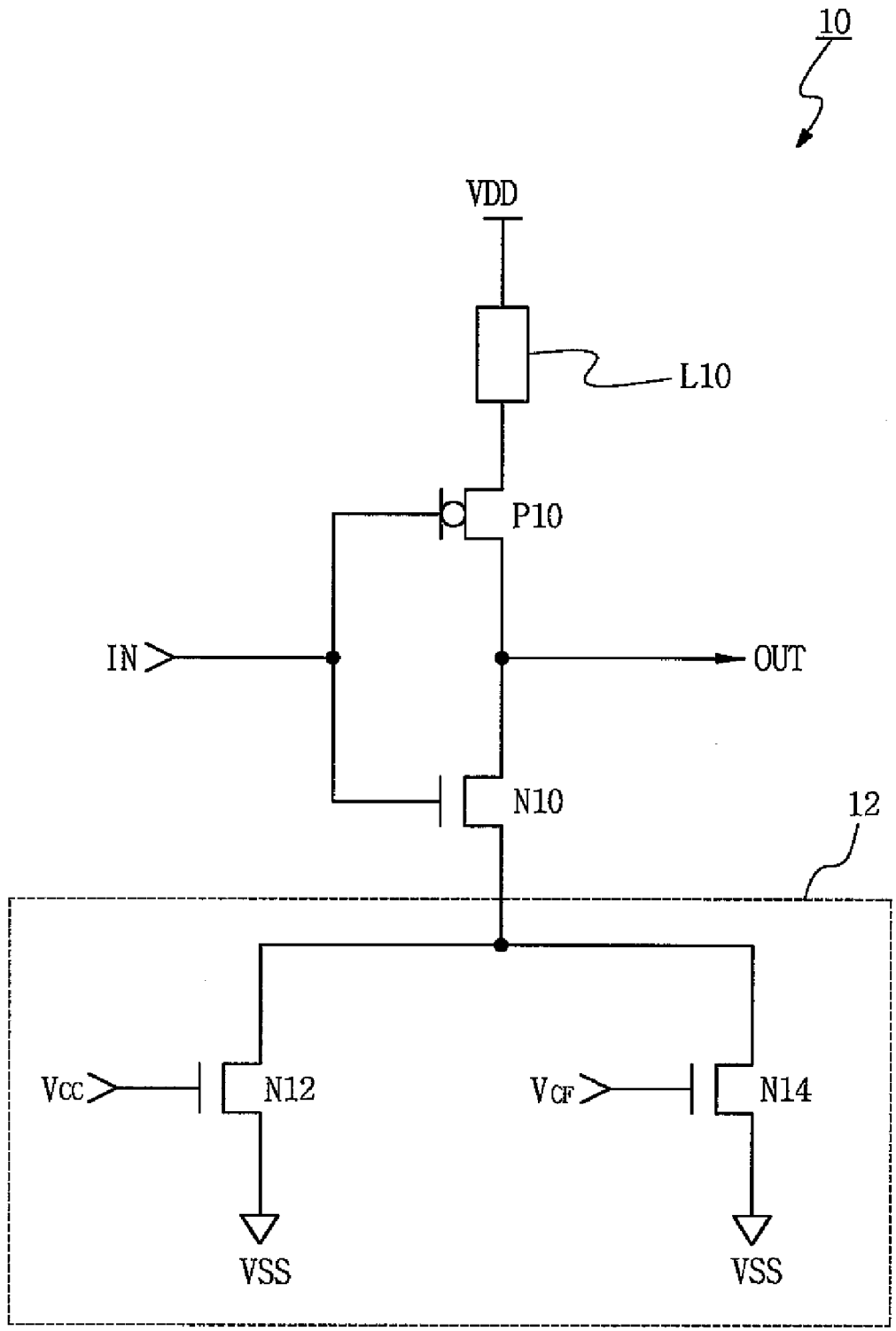
FIG. 2 is a circuit diagram of an inverter circuit shown in FIG. 1.
Figure 3:
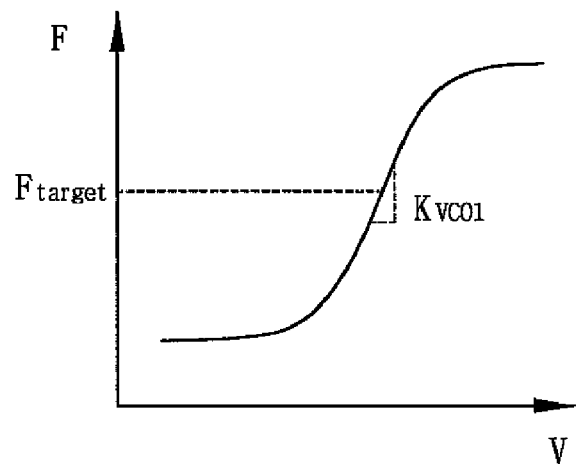
FIG. 3 is a graph illustrating the relationship between voltage and frequency of the VCO in FIG. 1.
Figure 5:
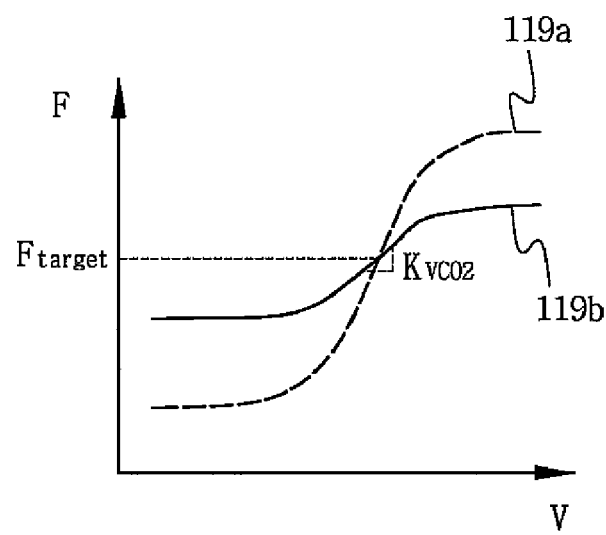
FIG. 5 is a graph illustrating the relationship between voltage and frequency of the exemplary disclosed VCO of FIG. 4.

FIG. 5 illustrates an output of VCO according to some embodiments of the invention. A dotted-line graph 119a indicates a relation between an input voltage and output frequency before performing current control through a reference direct-current voltage $V_{CR}$, and a solid line graph 119b indicates a relation between an input voltage and output frequency when the current control is performed through the reference direct-current voltage $V_{CR}$.

As shown in FIG. 5, the dotted-line graph 119a has a similar characteristic to a voltage versus frequency of the conventional VCO. However, when the control using the reference direct-current voltage $V_{CR}$ is performed, the slope of the graph reduces as shown in the solid line graph 119b. That is, a frequency change rate for a voltage change rate becomes small. After controlling the oscillation unit 110 using the reference direct-current voltage $V_{CR}$, a coarse tuning and a fine tuning as performed in the conventional art are performed through a use of control voltage $V_{CC}$, $V_{CF}$. At this time, in the coarse and fine tuning, the frequency change rate for the voltage change rate is small as compared with the conventional art. Therefore, it may be possible to easily find the target frequency $F_{target}$. Furthermore, the gain $K_{VCO2}$ of the VCO is now less than that in the conventional art. This low gain $K_{VCO2}$ may reduce the amount of jitter input to the PLL. Thus, use of a reference direct-current voltage $V_{CR}$ to control the current to oscillation unit 110 in addition to the provision of a coarse voltage $V_{CC}$ and fine voltage $V_{CF}$ may reduce the gain of the VCO.

There are two methods available to determine a reference direct-current voltage $V_{CR}$ corresponding to the reference clock frequency provided to a PLL circuit. One of the two methods involves determining the reference direct-current voltage $V_{CR}$ by measuring the reference clock frequency applied to the VCO. Specifically, clock edges are counted by using a generic counter in a semiconductor memory device that uses the VCO or a specific counter to measure the reference clock frequency. Once the reference clock frequency is determined, the reference direct-current voltage $V_{CR}$ is controlled by using a voltage divider that operates based on the determined clock frequency.

In another method, the system recognizes a reference clock frequency that is applied to a semiconductor memory device employing the VCO or a PLL circuit. This clock frequency is then provided as a code such as, for example, a Mode Register Set (MRS) code that provides a division factor to a voltage divider. The voltage divider that operates based on the MRS code is then used to control the reference direct-current voltage $V_{CR}$. Because the first method involves the use of a counter while the second does not, it may be beneficial to use the second method instead of the first in order to keep manufacturing costs down.

Figure 6:
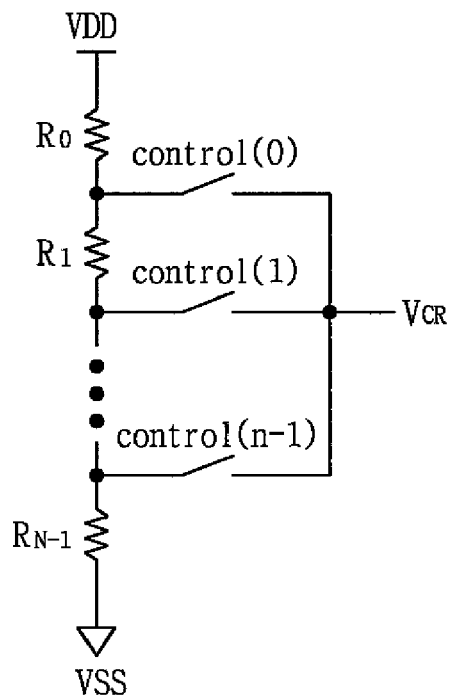
FIG. 6 is a circuit diagram of a voltage divider having a switching operation through a control bit according to an exemplary disclosed embodiment.

FIG. 6 illustrates a voltage divider used to determine a reference direct-current voltage $V_{CR}$ according to an exemplary disclosed embodiment. The voltage divider in FIG. 6 includes a plurality of resistors $R_0 \sim R_{N-1}$ connected in series between a power source voltage VDD terminal and a ground VSS terminal. Furthermore, switches to perform a switching operation through a control bit (control (0)~control (n-1)) are connected between the resistors $R_0 \sim R_{N-1}$.

The voltage divider generates the reference direct-current voltage $V_{CR}$ through the switching performed when the control bit (control (0)~control (n-1)) is provided. For example, when a control bit is provided as '0', a switch of the control bit (control(0)) is closed and so a voltage level obtained by deducting a voltage across the resistance $R_0$ from the power source voltage VDD is determined as the reference direct-current voltage $V_{CR}$. Furthermore, when the control bit is provided through MRS code, the reference direct-current voltage $V_{CR}$ is decided through a switching operation based on the control bit.

Figure 8:
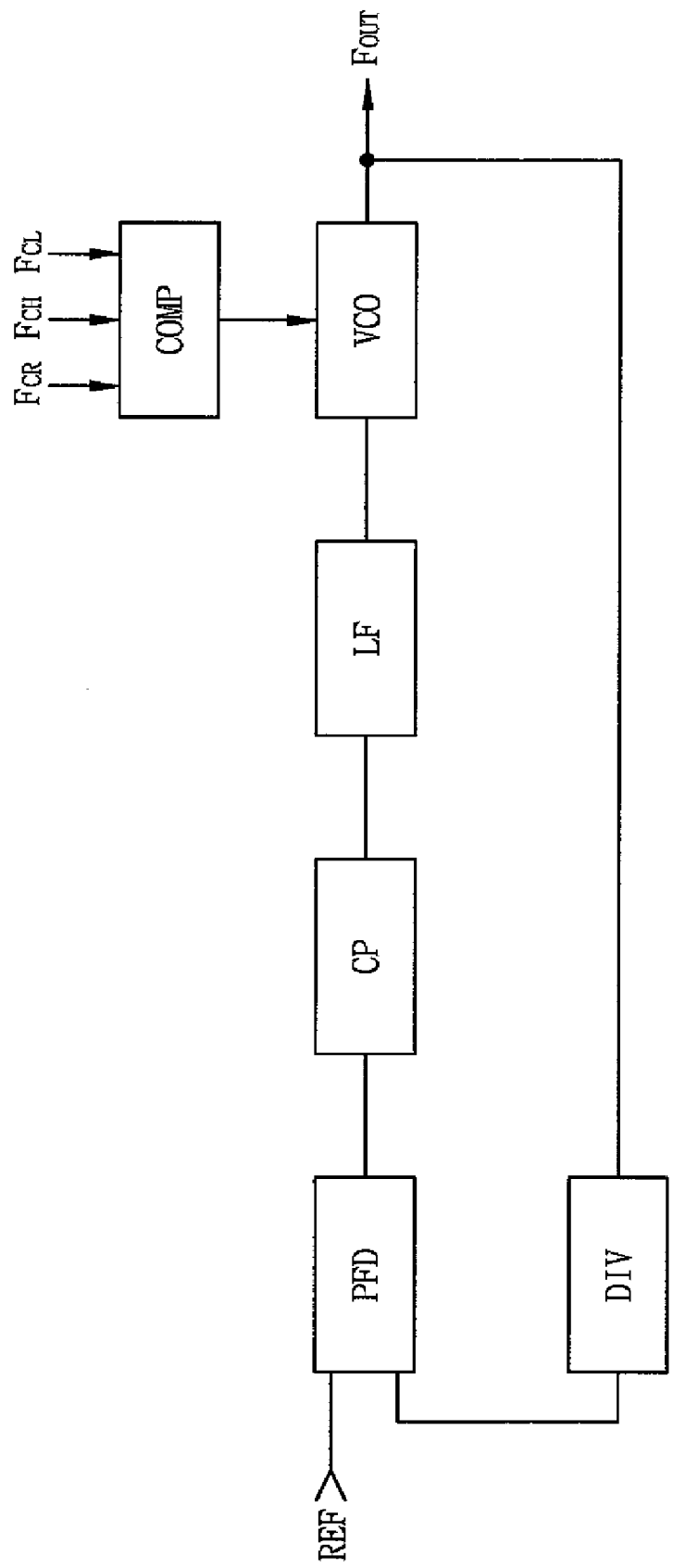
FIG. 8 is a block diagram of a PLL circuit having the VCO of FIG. 4 according to an exemplary disclosed embodiment.

Referring to FIG. 8, a comparator COMP is configured to compare whether the reference direct-current voltage $V_{CR}$ determined through the voltage divider is within a normal range or not. For example, the comparator COMP compares frequency $F_{CL}$ corresponding to a ground level, frequency $F_{CH}$ corresponding to power source voltage, and frequency $F_{CR}$ corresponding to the reference direct-current voltage $V_{CR}$, and decides as to whether the frequency $F_{CR}$ corresponding to the reference direct-current voltage $V_{CR}$ is in the normal range, or not. In an exemplary embodiment, this normal range is the range of frequencies between $F_{CL}$ and $F_{CH}$.

Figure 7:
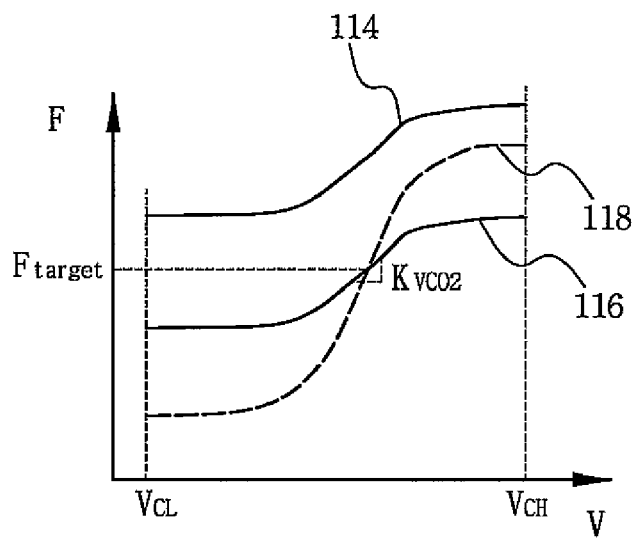
FIG. 7 is a graph illustrating the operation of a comparator according to an exemplary disclosed embodiment.

This will be described referring to graphs of a voltage versus frequency shown in FIG. 7, as follows. As shown in FIG. 7, when the frequency $F_{CR}$ corresponding to the reference direct-current voltage $V_{CR}$ is not between the frequency $F_{CL}$ corresponding to the ground level and the frequency $F_{CH}$ corresponding to the power source voltage, the graph of a control voltage versus output frequency decided through the control bit may be represented as graph 114 shown in an upper side of FIG. 7. In this case, the counter operates to increase or reduce the control bit one-by-one so as to provide another reference direct-current voltage $V_{CR}$.

On the other hand, when the frequency $F_{CR}$ corresponding to the reference direct-current voltage $V_{CR}$ is between the frequency $F_{CL}$ corresponding to the ground level and the frequency $F_{CH}$ corresponding to the power source voltage, the control bit is fixed, to confirm the direct voltage $V_{CR}$. Then, fine tuning of the oscillation unit 110 is performed through the variable current source 112b.

The frequency $F_{CL}$ corresponding to the ground level and the frequency $F_{CH}$ corresponding to the power source voltage can be obtained from an output of the VCO where the VCO is supplied with a ground level voltage VSS or power source voltage VDD. To this end, the VCO disclosed above or any other VCO known in the art may be used to obtain a frequency $F_{CL}$ and a frequency $F_{CH}$.

FIG. 8 illustrates a PLL circuit having a VCO according to an exemplary disclosed embodiment. As shown in FIG. 8, a PLL includes a phase-frequency detector (PFD), a charge pump (CP), a loop filter (LF), a VCO, and a frequency divider (DIV). Specifically, the PLL receives a reference clock REF and outputs a signal in relation to the frequency and phase of the reference clock REF. The frequency divider DIV may be generally used when a frequency higher than that of the reference clock is needed.

The phase-frequency detector PFD compares the frequency and phase of a divided signal that is output from the divider DIV with the frequency and phase of the reference clock REF, and outputs an up signal or a down signal based on the comparison result. In particular, the up signal is provided so that the frequency of an oscillation clock increases. This occurs when the frequency of the divided signal output by the divider DIV is lower than the reference clock REF. Similarly, the down signal is provided so that the VCO oscillates at a lower frequency when the divided clock is faster than the reference clock REF.

The VCO outputs a high frequency or low frequency according to the control voltage, thus the up signal increases the control voltage of the VCO. This happens when the output of the PFD passes through the charge pump CP and the loop filter LF, so that the VCO outputs a frequency higher than before. Meanwhile, the down signal lowers the control voltage of the VCO which passes through the charge pump CP and the loop filter LF, so that the VCO oscillates at a relatively lower frequency.

Unlike the conventional art, in an exemplary embodiment, the comparator COMP provides an input to the VCO. Furthermore, as described above, the comparator COMP is configured to generate a reference direct-current voltage $V_{CR}$ and provide the reference direct-current voltage $V_{CR}$ to the VCO. The use of the reference direct-current voltage $V_{CR}$ as an input provided to a VCO may help stabilize the output of the VCO and also help reduce jitter in the output of the VCO. This reduction in jitter and stabilization in the output of the VCO may help improve the overall operation of the PLL circuit using the VCO.

As also described above, the frequency divider performs a frequency division operation of dividing the frequency of the oscillation clock signal output by the VCO. Furthermore, when the frequencies and phases of the reference clock REF and the divided clock are equal, the PLL circuit is stabilized. For example, when the frequency divider performs a decimal division operation and a reference clock is 125 MHz, the PLL circuit generates an oscillation clock of 1.25 GHz and a divided clock of 125 MHz having the same phase as the reference clock after stabilization.

It will be apparent to those skilled in the art that modifications and variations can be made in the present invention without deviating from the spirit or scope of the invention.

Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims

What is claimed is:

1. A voltage controlled oscillator (VCO), comprising:
a plurality of oscillation units connected in cascade to form a chain; and
a plurality of current source sections operatively connected to the oscillation units, the current source sections each being configured to control current provided to the oscillation units, wherein each of the current source sections includes:
at least one fixed current source configured to perform a current control of a corresponding oscillation unit by using a fixed voltage; and
at least one variable current source configured to perform a current control of the corresponding oscillation unit by using a variable voltage,
wherein the fixed voltage is a reference direct-current voltage corresponding to a reference clock frequency of a phase locked loop (PLL) that includes the VCO,
wherein the reference direct-current voltage is generated through a switching operation of a voltage divider, the switching operation being based on a control bit provided to the voltage divider, and
wherein the VCO is configured to receive the reference direct-current voltage from a comparator, the comparator being configured to determine whether or not an output clock frequency of the VCO is within a normal range by comparing an output clock frequency range of the VCO with the reference clock frequency on the condition that the fixed voltage is inputted to the VCO.

2. The VCO of claim 1, wherein the oscillation unit is one of an inverter circuit, a mirror circuit and a differential delay circuit.

3. The VCO of claim 1, wherein at least one of the reference clock frequency and the control bit is provided as a Mode Register Set (MRS) code of a semiconductor memory device including the PLL circuit.

4. A phase lock loop (PLL) circuit, comprising:
a phase and frequency detector configured to compare a phase and a frequency of a reference clock signal with a phase and a frequency of a signal output from a voltage divider, and to generate a signal based on the comparison;
a charge pump configured to generate current or discharge current in response to the comparison signal output from the phase and frequency detector;
a loop filter configured to filter the charge current or the discharge current output from the charge pump, to eliminate a high frequency component, and generate a control voltage;
a voltage controlled oscillator configured to generate an output frequency corresponding to the control voltage based on an initial current control with a fixed voltage and a subsequent current control with a variable voltage;
a comparator electrically connected to the voltage controlled oscillator; and
a frequency divider configured to divide the output frequency by a given number and generate an oscillation clock frequency,
wherein the fixed voltage is a reference direct-current voltage corresponding to the reference clock frequency,
the voltage controlled oscillator comprises:
a plurality of an oscillation units connected in cascade to form a chain, and
a plurality of current source sections operatively connected to the oscillation units, the current source sections each being configured to control current provided to the oscillation units, and each of the current source sections includes:
at least one fixed current source configured to perform a current control of a corresponding oscillation unit by using a fixed voltage; and
at least one variable current source configured to perform a current control of the corresponding oscillation unit by using a variable voltage, and
wherein the reference direct-current voltage is generated through a switching operation of a voltage divider, the switching operation being based on a control bit provided to the voltage divider, and
wherein the voltage controlled oscillator is configured to receive the reference direct-current voltage from the comparator, the comparator being configured to determine whether or not an output clock frequency of the voltage controlled oscillator is within a normal range by comparing an output clock frequency range of the voltage controlled oscillator with the reference clock frequency on the condition that the fixed voltage is inputted to the voltage controlled oscillator.

5. The PLL circuit of claim 4, wherein the oscillation unit is one of an inverter circuit, a mirror circuit, and a differential delay circuit.

6. The PLL circuit of claim 4, wherein at least one of the reference clock frequency and the control bit is provided as a Mode Register Set (MRS) code of a semiconductor memory device including the PLL circuit.

* * * * *